United States Patent
Blossfeld et al.

(10) Patent No.: US 6,847,206 B1
(45) Date of Patent: Jan. 25, 2005

(54) INTEGRATED CIRCUIT WITH A SENSOR ELEMENT FOR PROVIDING AN ENCODED OUTPUT SIGNAL

(75) Inventors: Lothar Blossfeld, Breitnau (DE); Ralf Janke, Gundelfingen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/743,926

(22) PCT Filed: Jul. 15, 1999

(86) PCT No.: PCT/EP99/05052
§ 371 (c)(1),
(2), (4) Date: Mar. 19, 2001

(87) PCT Pub. No.: WO00/04640
PCT Pub. Date: Jan. 27, 2000

(30) Foreign Application Priority Data

Jul. 16, 1998 (DE) .......................................... 198 31 978

(51) Int. Cl.$^7$ ................................................. G01B 7/14
(52) U.S. Cl. ................................ 324/207.26; 324/207.2
(58) Field of Search .......................... 324/207.2, 207.21, 324/207.26, 133, 251, 252, 235, 207.24, 207.25; 330/32 H, 32 R; 327/70

(56) References Cited

U.S. PATENT DOCUMENTS

| | | | |
|---|---|---|---|
| 4,408,164 A | * 10/1983 | East et al. .................... 327/70 |
| 4,415,856 A | * 11/1983 | Welles .................... 324/207.25 |
| 5,066,953 A | 11/1991 | Lengenfelder et al. ...... 341/155 |
| 5,105,186 A | 4/1992 | May ........................... 340/784 |
| 5,218,298 A | * 6/1993 | Vig ............................. 324/251 |
| 5,336,980 A | 8/1994 | Levers ........................ 318/444 |
| 5,442,313 A | 8/1995 | Santos et al. ............... 327/355 |
| 5,821,745 A | 10/1998 | Makino et al. ......... 324/207.25 |

FOREIGN PATENT DOCUMENTS

| | | |
|---|---|---|
| DE | 41 41 547 | 6/1993 |
| DE | 43 06 950 | 9/1994 |
| DE | 43 37 518 | 4/1995 |
| DE | 44 38 507 | 7/1995 |
| EP | 0 844 464 A | 5/1998 |

* cited by examiner

Primary Examiner—Jay Patidar
(74) Attorney, Agent, or Firm—Gauthier & Connors LLP

(57) ABSTRACT

The invention relates to an integrated circuit with a single sensor element (1) for converting a physical variable into an electrical signal, comprising a comparator unit (4) by which means the electrical signal of the sensor element (1) can be compared with various different threshold values in order to produce different discreet circuit states and an output unit (5) for outputting an output signal representing the different discreet circuit states or the comparator unit (4). The threshold values of the comparators of the comparator unit (4) are stored in a storage unit of the integrated circuit in such a way that they can be regulated with a control device (3). The integrated circuit has a single output terminal (7a) on which the various circuit states of the electrical signal can be picked off in code.

18 Claims, 3 Drawing Sheets

INTEGRATED CIRCUIT WITH A SENSOR ELEMENT FOR PROVIDING AN ENCODED OUTPUT SIGNAL

BACKGROUND OF THE INVENTION

The invention relates to an integrated circuit arrangement with a sensor element, and in particular to an integrated circuit sensor such as a magnetic field transducer that provides an encoded output signal on an integrated circuit lead.

Integrated circuit arrangements with sensor elements (e.g. with magnetic sensors) that detect mechanical switching states in a large number of consumer and automotive applications are known. They detect a mechanical switching state by a variable magnetic field, which represents the changed position on the basis of a variable distance between the magnetic field sensor and a movable magnet. The physical variable of magnetic field strength is thus used as a measure for determining the switching state. If the magnet approaches the transducer, which converts the magnetic field strength into an analog electrical signal, the switching state "turned on" is represented at the output of the sensor circuit when the distance becomes less than a certain distance A1. If the distance becomes less than a further distance A2, the output signal represents "turned off". This clearly shows that this sensor circuit can represent a switching state as either "turned on" or "turned off". If more switching states are required, it is necessary to use a cascade of such sensor circuits. However, this results in a complex circuit structure that is relatively bulky, expensive and unreliable. Furthermore, such total circuits have a high EMC risk, which is a great disadvantage in the automotive field.

Therefore, there is a need for an integrated circuit sensor that receives an input signal and compares the input signal against a number of threshold values to determine the switching state efficiently within the integrated circuit.

SUMMARY OF THE INVENTION

Briefly, according to an aspect of the present invention, an integrated circuit sensor comprises a comparator that receives an input signal, and compares the input signal against a plurality of predetermined threshold values and provides a plurality of comparator output signals each indicative of whether or not the input signal exceeds an associated one of the plurality of predetermined threshold values. An output stage receives the plurality of comparator output signals and encodes state information associated with the plurality of comparator output signals to provide on a integrated circuit lead an encoded output signal indicative of the state information associated with the plurality of comparator signals.

According to another aspect of the invention, an integrated circuit sensor comprises a transducer element that provides a transducer output signal and a comparator that receives the transducer output signal. The comparator compares a signal indicative of the transducer output signal against a plurality of adjustable threshold values and provides a plurality of comparator output signals each indicative of one of an associated plurality of switching states. An output stage receives the plurality of comparator output signals and encodes switching state information associated with the plurality of comparator output signals to provide on a bi-directional integrated circuit lead an encoded output signal indicative of the state information associated with the plurality of comparator signals.

According to yet another aspect of the invention, an integrated circuit sensor comprises a transducer element that provides a transducer output signal. An amplifier receives the transducer output signal and provides an amplified transducer output signal. A comparator network receives the amplified transducer output signal, and compares a signal indicative of the amplified transducer output signal against a plurality of adjustable threshold values to determine a state of the amplified transducer output signal, and provides a plurality of comparator output signals indicative of the state of the amplified transducer output signal. An output stage receives the plurality of comparator output signals and encodes switching state information associated with the plurality of comparator output signals to provide on a integrated circuit lead an encoded output signal indicative of the state.

The inventive circuit arrangement, which can represent more switching states than only "turned on" or "turned off", comprises a control unit to control the sensor circuit, and an input to which an analog electrical signal is conducted.

The analog electrical signal corresponds to an analog physical variable, such as pressure, force, acceleration, magnetic field strength, electromagnetic field strength, temperature, light intensity, or the like. This electrical input signal is compared with several thresholds in an analytical unit or a comparator unit. If the value of the signal falls above or below these individual thresholds, an output signal is generated that represents a number of different switching states, which extend beyond the single switching state of "turned on" or "turned off". The output signal is conducted from the analytical unit or comparator unit to the output stage and is made available to the environment of the sensor circuit for further use.

The invention thus succeeds in representing various differentiated switching positions using a single sensor circuit, which comprises a single control unit, a single analytical unit, a single output stage, and a single input, and which is especially simple, compact, and reliable. For example, this can be used in connection with the contact-free picking off of the many positions of the wiper lever in an automobile by Hall sensors and an appropriate, series-connected, inventive sensor circuit. The various positions of the wiper lever, such as, for example, "off", "on slow", "on fast", "on very fast", or "timed operation", are converted by the integrated circuit arrangement of the present invention into an electrical output signal, which can uniquely and discretely represent these many switching states.

Advantageously, a cascade arrangement of several sensor circuits, as is the case in the prior art, can be dispensed with. This is associated with a considerable reduction of costs, of the space needed for the circuits, of the complexity of the circuit and wiring, with a marked reduction of trouble-proneness, as a result of the reduction in the number of components, and with an improvement as regards EMC sensitivity, due to the reduction of EMC-sensitive components and EMC-generating components. The inventive sensor arrangement is thus best suited for the automotive field, which precisely has special requirements for EMC compatibility and compact arrangements.

In addition, this sensor circuit proves to be a universal sensor circuit, since it can interact with various transducers for converting analog physical variables into analog electrical signals. In this case, the analog electrical signal only needs to be amplified and then conducted to the input and matched to the thresholds, as appropriate.

In a preferred embodiment, the transducer for converting the analog physical variable into an analog electrical input signal is connected to the single input, and thus is integrated into the sensor circuit. This makes it possible to adapt the transducer and sensor optimally to the remaining sensor circuit, and thus to create a closed and standardized sensor circuit, which no longer requires any specific adjustment by the user. This eliminates difficulties associated with such a standardized circuit with a transducer, especially if the user, when adapting the output signal of the transducer to the remaining circuit does not correctly take into account the relationships with the threshold values. This regularly results in considerable problems regarding the unambiguous nature of the output signal and thus the representation of the plurality of discrete circuit states. Furthermore, it is now possible to design the standardized sensor circuit with a transducer especially optimized as regards space and EMC, since the interactions of the transducer with the remaining sensor circuit can already be taken into account in the design.

The sensor circuit preferably has an output stage with a single output. At this output, the plurality of discrete circuit states is represented, for example, by the pulse/pause ratio of the output signal or by a digital signal, which is not necessarily binary coded, or by an analog signal, which has a number of signal steps, corresponding to the plurality of switching states. For example, if five switching states are to be represented, the pulse/pause ratio can vary between 5/1, 4/2, 3/3, 2/4, and 1/5. Besides these examples, one can also conceive of other ways of representing the plurality of switching states with a single output. The design of the sensor circuit with a single output constitutes a sensor circuit which is especially cost-optimized, since a plurality of parallel outputs need no longer be made available.

In another embodiment, the output stage has the same number of outputs as the number of different discrete switching states that must be represented. This increased number of outputs, which correlate with the various switching states, makes it possible to turn various devices on or off simultaneously and independently, corresponding to the plurality of various switching states. In this case, each output has associated with it a corresponding device. A typical application of such a sensor circuit is its use with a multi-function switch, which can turn various devices on or off individually or jointly, depending on the position of the switch lever. Another typical application of such a sensor circuit is in combination with a brightness sensor, which, with increasing darkness, selectively turns on more and more light sources, so as always to assure sufficient illumination in an interior room. The individual light sources are activated selectively by their own circuit output.

Besides the two extremes of a single output and the same number of outputs as there are switching states, it is also possible for the number of outputs to lie between these extremes. This represents a compromise between the most economical sensor circuit with a single output and the technically optimized sensor circuit with many outputs, each of which is always actuated selectively.

According to a preferred design, the thresholds may be adjustable. As a result, the circuit can be adapted to the particular external circumstances for forming the output signal as a function of the electrical input signal, without creating a new, corresponding sensor circuit. It is thus possible to adapt the circuit arrangement to possible time changes, such as aging effects, especially in the transducer associated with the circuit arrangement. Production tolerances or changes due to various use conditions, for example due to temperature effects and the like, can thus be taken into account simply and economically. This considerably expands the field of application of the sensor circuit, by further increasing its functionality, without requiring complex or expensive external circuits to adapt the output signal or the input signal. This results in a simple and reliable sensor circuit, which is especially characterized by an economical and flexible design.

An especially preferred design of the sensor circuit makes it possible for the user to set the thresholds himself. This can be done in a special learning mode of the sensor circuit, in which the desired switching ranges of the sensor circuit are approached, and the analytical unit in collaboration with the control unit determines the necessary parameters of the threshold values and stores them in an appropriate memory, which in particular is designed as a non-volatile memory. This results in an especially flexible and universally applicable sensor circuit, which allows the user a large and manifold field of application.

The thresholds preferably are combined into threshold pairs, which specify a range of values with which a certain discrete switching state is associated. These threshold pairs preferably are closely spaced, so that the range in between, which does not necessarily have a particular switching state associated with it, is kept very narrow. In this way, the sensor circuit generates clear and defined switching states over nearly the entire measurement range of the analog physical variable. The choice of threshold pairs makes it possible, in a simple way, to characterize uniquely and very reliably circuit switching states, and thus to design a very reliable sensor circuit.

The sensor circuit with the threshold pairs preferably is designed so that a hysteresis exists between the individual threshold pairs. This assures that a defined switching state exists in the preferably narrow range between the individual threshold pairs. If there are frequent small fluctuations about a threshold, this assures that the sensor circuit will not constantly switch back and forth between the individual switching states, which would be undesirable. This assures that the system will assume certain switching states very reliably and persistently.

The sensor circuit preferably is designed such that it ignores brief changes of the input signal and does not consider these for changing the switching signal. Such a design does not indeed prevent short-term noise signals, which can occur again and again in an electronic circuit, whether due to electromagnetic radiation from the outside or due to switching interferences, but it does prevent their negative effects. This can be achieved by integrating or averaging elements at the input. This makes the sensor circuit especially insensitive to noise.

The sensor circuit preferably is designed as an integrated circuit, which is especially advantageous as regards EMC compatibility and small size. In particular, a sensor circuit with an integrated transducer in the form of an integrated circuit proves to be a complete sensor circuit, which requires very few pins, and thus also is very economical and not very trouble-prone. Furthermore, such a complete sensor circuit proves to be extremely small. Its predestined application thus is in the automotive field, since tight spatial circumstances and special requirements for EMC compatibility prevail there.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
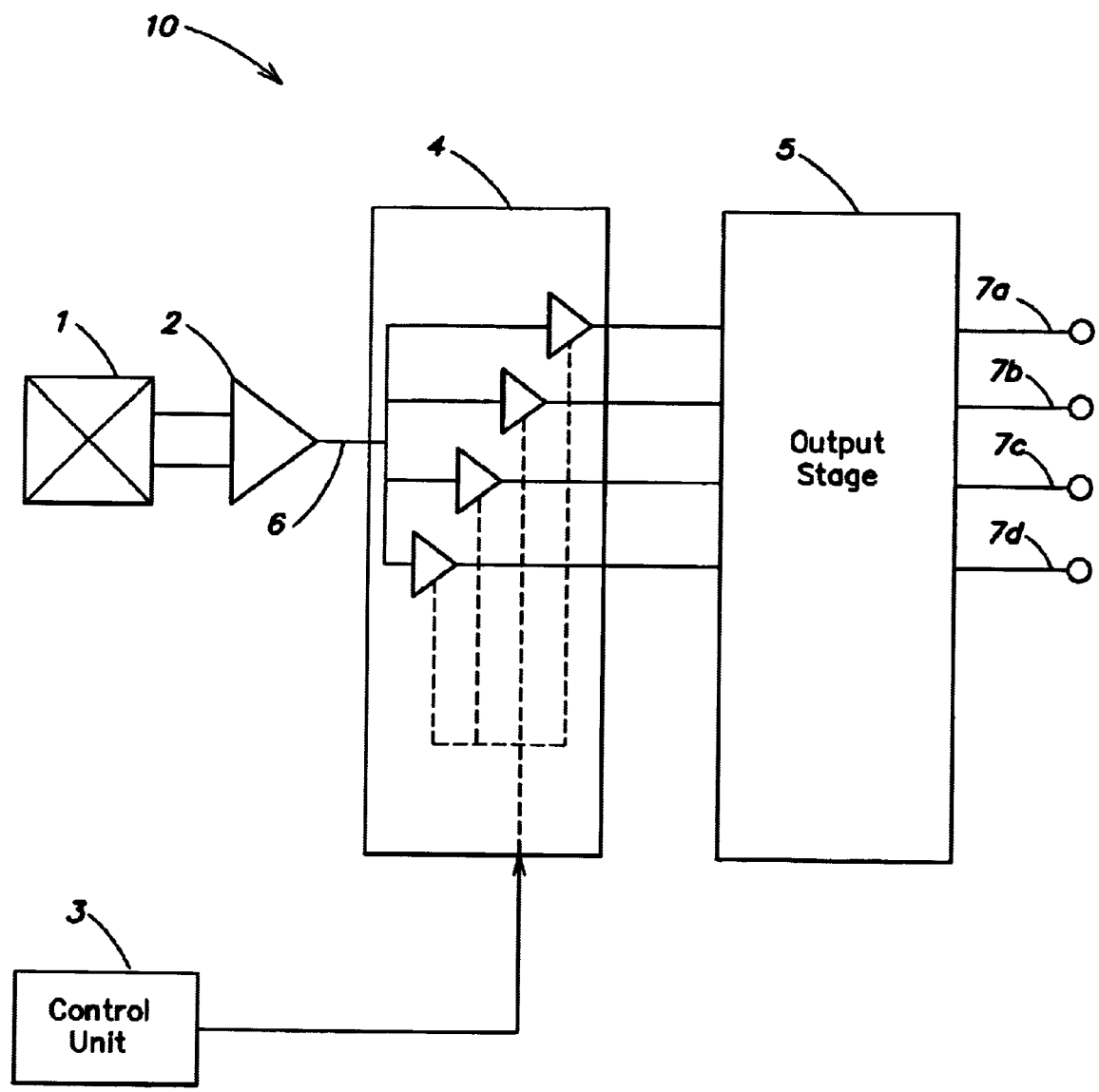
FIG. 1 is a block diagram illustration of an integrated circuit sensor.

FIG. 1 is a block diagram illustration of an integrated circuit sensor 10. The sensor 10 includes a transducer 1, which converts an analog physical variable, for example a temperature or a magnetic field strength or a pressure, into an electrical signal, and conducts this signal to an amplifier 2. The amplifier 2 provides an amplified electrical signal on a line 6 to an analytical unit 4. The analytical unit 4 has a plurality of comparators, each of whose respective comparator thresholds can be adjusted by a control unit 3. The parameters for the. thresholds of the comparators in the analytical unit 4 are stored in a memory (not shown) in the control unit 3, and are used to control the comparator thresholds.

Depending on the relationship of the amplified signal on the line 6 to the respective comparator thresholds, the analytical unit 4 generates an appropriate output signal from each of the comparators, and the comparator output signals are provided to an output stage 5. The output stage transforms the signals from the analytical unit 4 into an output signal, which is distributed among the four outputs 7a, 7b, 7c, and 7d. Because there are different outputs 7a, 7b, 7c, 7d from the output stage 5, it is possible to actuate directly four different devices or also groups of devices, connected to the outputs 7a, 7b, 7c, 7d, selectively and independently of one another. Therefore, depending on the magnitude of an analog physical variable, several devices can be turned on or off by the sensor circuit 10, independently of one another and without complicated additional decoder circuits.

Figure 2:
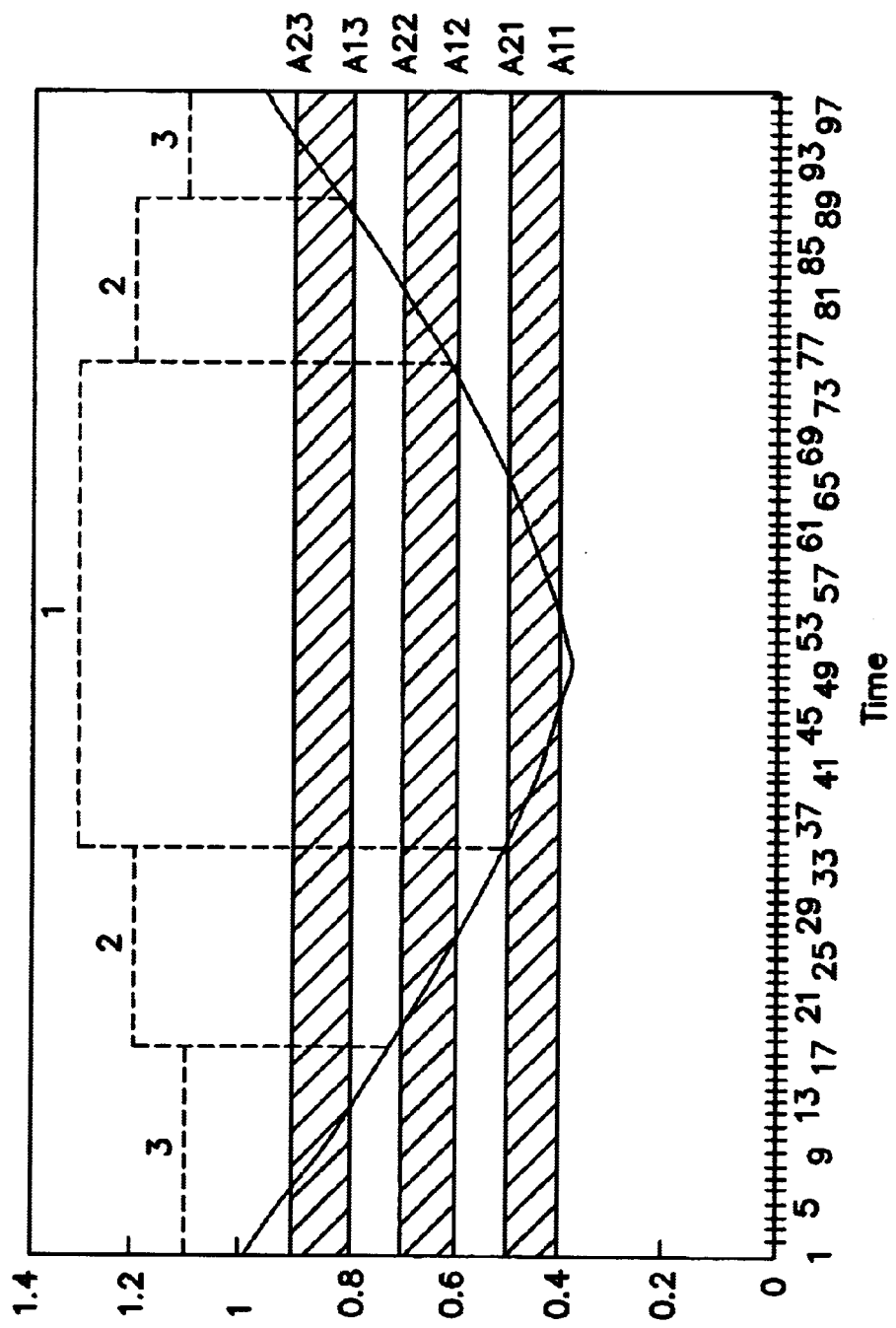
FIG. 2 is a plot of voltage versus time to illustrate switching of the various thresholds associated with the integrated circuit sensor.

FIG. 2 shows a switching process by way of example. FIG. 2 shows the time progress of an analog measurement variable, in an arbitrary unit, as a solid line. This analog measurement variable falls from the value 1 to its lowest point just below 0.4, and then again rises to a value of about 1. Three pairs of thresholds are shown, namely A11, A21; A12, A22; A13 and A23, such that:

$$A11 < A21 < A12 < A22 < A13 < A23$$

FIG. 2 shows the progress of the output signal, which is shown as a dashed line. The output signal shows three different, discrete switching states, the switching state 1, 2, and 3. If the analog measurement variable lies within the interval A11 to A21, the diagram shows the switching state 1. If the analog measurement variable lies in the threshold interval between A12 and A22, the output signal assumes the switching state 2. If the analog measurement variable lies within the threshold interval A13 to A23, it assumes the switching state 3.

Furthermore, the plot of FIG. 2 shows that a hysteresis exists between the threshold intervals formed through the threshold pairs. This assures that, when the analog measurement variable falls from an analog value within the interval A13 to A23 to below the limit A13, the measurement state is retained, until the upper limit of the next threshold interval A12, A22 is reached. Only when the analog measurement variable falls to the threshold A22, does the signal change from the switching state 3 to the switching state 2. The like applies to a further drop to the threshold A21, where the signal then changes from switching state 2 to switching state 1. The like also applies to a rise of the analog measurement variable, where the original switching state is retained until the lower limit of the next threshold interval is reached. For example, when the analog measurement variable rises from a value 0.4, corresponding to the threshold A11, across the threshold A21 until it reaches the lower threshold A12, the switching state 1 is retained, even though the threshold interval A11 to A21, corresponding to the actual switching state 1, has been left behind. Upon reaching the threshold A12, the signal assumes the switching state 2, and this is retained during a further rise of the analog measurement variable, until this reaches the threshold A13. Then there is a transition from the switching state 2 to the switching state 3.

This structure of the thresholds as three threshold pairs, which are respectively connected to one another through a hysteresis region, makes it possible to reliably represent three discrete switching states as a function of a varying analog measurement variable. The presence of hysteresis regions in particular assures a definite switch between the individual switching states and prevents undesirable frequent switching when there are fluctuations about a threshold. This makes the sensor circuit into an especially reliable and readily handled circuit arrangement, which can uniquely represent a plurality of discrete switching states.

Figure 3:
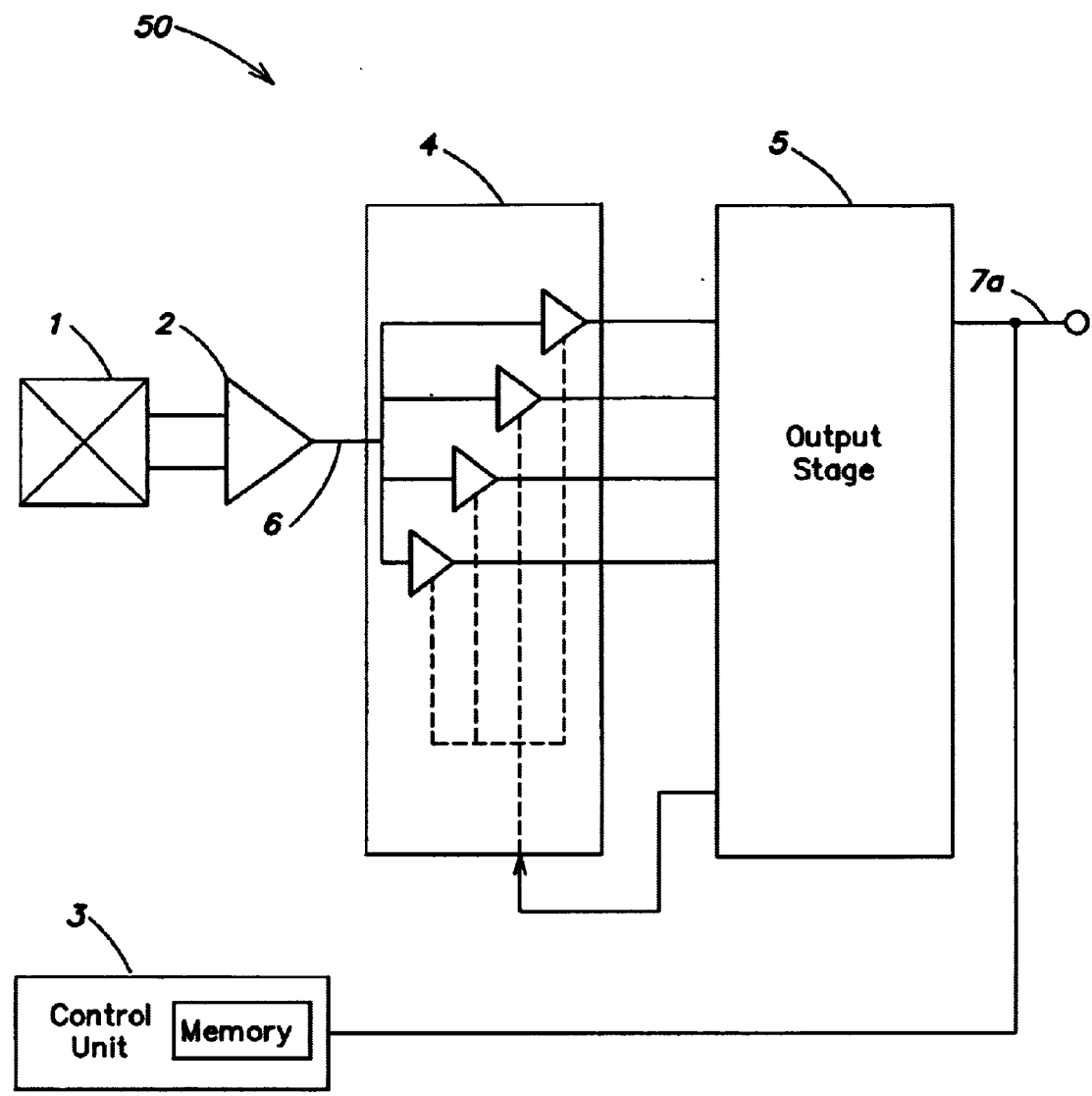
FIG. 3 is a block diagram illustration of an alternative embodiment integrated circuit sensor.

FIG. 3 is a block diagram illustration of an alternative embodiment integrated circuit sensor 50. However, the circuit 50 now has a single output terminal 7a, from which the various switching states of the electrical signal can be picked off in coded form. This single output terminal 7a can also be used as the input terminal for adjusting the thresholds.

Although the present invention has been shown and described with respect to several preferred embodiments thereof, various changes, omissions and additions to the form and detail thereof, may be made therein, without departing from the spirit and scope of the invention.

What is claimed is:

1. An integrated circuit sensor, comprising:
    a comparator that receives an input signal, and compares said input signal against a plurality of predetermined threshold values and provides a plurality of comparator output signals each indicative of whether or not said input signal exceeds an associated one of said plurality of predetermined threshold values; and
    an output stage that receives said plurality of comparator output signals and encodes state information associated with said plurality of comparator output signals to provide on a integrated circuit lead an encoded output signal indicative of said state information associated with said plurality of comparator signals,
    wherein said output stage comprises means for generating said encoded output signal using pulse width modulation, wherein said state information is encoded within said encoded output signal based upon the pulse/pause ratio of said encoded output signal.

2. The integrated circuit sensor of claim 1, comprising a control unit that includes a memory device that stores and provides said plurality of predetermined threshold values.

3. The integrated circuit sensor of claim 2, wherein said memory device comprises a read/write memory device that allows said plurality of predetermined threshold values to be changed and stored in said read/write memory device.

4. The integrated circuit sensor of claim 2, comprising
    means for reading updated predetermined threshold values that are input to said integrated circuit sensor through said integrated circuit lead that also receives said encoded output signal, and for storing said updated predetermined threshold values in said memory device, which provides said updated predetermined threshold values to said comparator for comparison against said input signal.

5. An integrated circuit sensor, comprising:
a magnetic field transducer comprising a Hall effect transducer that generates and provides an input signal;
a comparator that receives said input signal, and compares said input signal against a plurality of predetermined threshold values and provides a plurality of comparator output signals each indicative of whether or not said input signal exceeds an associated one of said plurality of predetermined threshold values;
an output stage that receives said plurality of comparator output signals and encodes state information associated with said plurality of comparator output signals to provide on a integrated circuit lead an encoded output signal indicative of said state information associated with said plurality of comparator signals; and
a control unit that includes a memory device that stores and provides said plurality of predetermined threshold values.

6. The integrated circuit sensor of claim 5, wherein said memory device comprises a read/write memory device that allows said plurality of predetermined threshold values to be changed and stored in said read/write memory device.

7. The integrated circuit sensor of claim 5, comprising
means for reading updated predetermined threshold values that are input to said integrated circuit sensor through said integrated circuit lead that also receives said encoded output signal, and for storing said updated predetermined threshold values in said memory device, which provides said updated predetermined threshold values to said comparator for comparison against said input signal.

8. An integrated circuit sensor, comprising:
a transducer element that provides a transducer output signal;
a comparator that receives said transducer output signal, and compares a signal indicative of said transducer output signal against a plurality of adjustable threshold values and provides a plurality of comparator output signals each indicative of one of an associated plurality of switching states; and
an output stage that receives said plurality of comparator output signals and encodes switching state information associated with said plurality of comparator output signals to provide on a bi-directional integrated circuit lead an encoded output signal indicative of said state information associated with said plurality of comparator signals;
wherein said output stage comprises means for generating said encoded output signal using pulse width modulation, wherein said state information is encoded within said encoded output signal based upon the pulse/pause ratio of said encoded output signal.

9. The integrated circuit sensor of claim 8, wherein said comparator comprises hystersis on each of said predetermined threshold values.

10. An integrated circuit sensor, comprising:
a transducer element that provides a transducer output signal;
an amplifier that receives said transducer output signal and provides an amplified transducer output signal;
a comparator network that receives said amplified transducer output signal, and compares a signal indicative of said amplified transducer output signal against a plurality of adjustable threshold values to determine a state of said amplified transducer output signal, and provides a plurality of comparator output signals indicative of said state of said amplified transducer output signal;
an output stage that receives said plurality of comparator output signals and encodes switching state information associated with said plurality of comparator output signals to provide on a integrated circuit lead an encoded output signal indicative of said state; and
a control unit that includes a memory device that stores and provides said plurality of adjustable threshold values.

11. An integrated circuit sensor, comprising:
a transducer element that comprises a magnetic field transducer and provides a transducer output signal;
an amplifier that receives said transducer output signal and provides an amplified transducer output signal;
a comparator network that receives said amplified transducer output signal, and compares a signal indicative of said amplified transducer output signal against a plurality of adjustable threshold values to determine a state of said amplified transducer output signal, and provides a plurality of comparator output signals indicative of said state of said amplified transducer output signal;
an output stage that receives said plurality of comparator output signals and encodes switching state information associated with said plurality of comparator output signals to provide on a integrated circuit lead an encoded output signal indicative of said state; and
a control unit that includes a memory device that stores and provides said plurality of adjustable threshold values.

12. An integrated circuit sensor, comprising:
a magnetic field transducer that generates and provides an input signal;
a comparator that receives said input signal, and compares said input signal against a plurality of predetermined threshold values and provides a plurality of comparator output signals each indicative of whether or not said input signal exceeds an associated one of said plurality of predetermined threshold values;
an output stage that receives said plurality of comparator output signals and encodes state information associated with said plurality of comparator output signals to provide on a integrated circuit lead an encoded output signal indicative of said state information associated with said plurality of comparator signals; and
a control unit that includes a memory device that stores and provides said plurality of predetermined threshold values.

13. An integrated circuit sensor, comprising:
a transducer element comprising a magnetic field transducer that provides a transducer output signal;
a comparator that receives said transducer output signal, and compares a signal indicative of said transducer output signal against a plurality of adjustable threshold values and provides a plurality of comparator output signals each indicative of one of an associated plurality of switching states;
an output stage that receives said plurality of comparator output signals and encodes switching state information associated with said plurality of comparator output signals to provide on a bi-directional integrated circuit lead an encoded output signal indicative of said state information associated with said plurality of comparator signals; and a control unit that includes a memory device that stores and provides said plurality of predetermined threshold values.

14. The integrated circuit sensor of claim 13, wherein said memory device comprises a read/write memory device that allows said plurality of predetermined threshold values to be changed and stored in said read/write memory device.

15. The integrated circuit sensor of claim 13, comprising means for reading updated predetermined threshold values that are input to said integrated circuit sensor through said integrated circuit lead that also receives said encoded output signal, and for storing said updated predetermined threshold values in said memory device, which provides said updated predetermined threshold values to said comparator for comparison against said signal indicative of said transducer output signal.

16. An integrated circuit sensor, comprising:

a transducer element that comprises a magnetic field transducer and provides a transducer output signal;

an amplifier that receives said transducer output signal and provides an amplified transducer output signal;

a comparator network that receives said amplified transducer output signal, and compares a signal indicative of said amplified transducer output signal against a plurality of adjustable threshold values to determine a state of said amplified transducer output signal, and provides a plurality of comparator output signals indicative of said state of said amplified transducer output signal;

an output stage that receives said plurality of comparator output signals and encodes switching state information associated with said plurality of comparator output signals to provide on a integrated circuit lead an encoded output signal indicative of said state; and a control unit that includes a memory device that stores and provides said plurality of predetermined threshold values.

17. The integrated circuit sensor of claim 16, wherein said memory device comprises a read/write memory device that allows said plurality of predetermined threshold values to be changed and stored in said read/write memory device.

18. The integrated circuit sensor of claim 16, comprising means for reading updated predetermined threshold values that are input to said integrated circuit sensor through said integrated circuit lead that also receives said encoded output signal, and for storing said updated predetermined threshold values in said memory device, which provides said updated predetermined threshold values to said comparator for comparison against said signal indicative of said amplified transducer output signal.

* * * * *

UNITED STATES PATENT AND TRADEMARK OFFICE
CERTIFICATE OF CORRECTION

PATENT NO. : 6,847,206 B1  
DATED : January 25, 2005  
INVENTOR(S) : Blossfeld et al.

It is certified that error appears in the above-identified patent and that said Letters Patent is hereby corrected as shown below:

Column 5,
Line 19, after "for the" delete "."

Signed and Sealed this

Seventeenth Day of May, 2005

JON W. DUDAS
*Director of the United States Patent and Trademark Office*